United States Patent
Cheng et al.

(10) Patent No.: US 9,491,879 B2
(45) Date of Patent: Nov. 8, 2016

(54) ELECTRONIC CARD

(71) Applicant: SiPix Technology Inc., Taoyuan County (TW)

(72) Inventors: Hsiao-Lung Cheng, Taoyuan County (TW); Wei-Chieh Liao, Taichung (TW); Chi-Mao Hung, Hsinchu (TW); Chun-An Wei, New Taipei (TW)

(73) Assignee: SiPix Technology Inc., Taoyuan (TW)

( * ) Notice: Subject to any disclaimer, the term of this patent is extended or adjusted under 35 U.S.C. 154(b) by 253 days.

(21) Appl. No.: 13/773,581

(22) Filed: Feb. 21, 2013

(65) Prior Publication Data

US 2013/0235536 A1 Sep. 12, 2013

(30) Foreign Application Priority Data

Mar. 8, 2012 (TW) .............................. 101107800 A

(51) Int. Cl.
| H05K 1/14 | (2006.01) |
| H05K 7/06 | (2006.01) |
| G06K 7/00 | (2006.01) |
| G06K 19/04 | (2006.01) |
| G06K 19/07 | (2006.01) |
| G06K 19/077 | (2006.01) |

(52) U.S. Cl.
CPC ........ *H05K 7/06* (2013.01); *G06K 7/00* (2013.01); *G06K 19/041* (2013.01); *G06K 19/07* (2013.01); *G06K 19/07707* (2013.01)

(58) Field of Classification Search
USPC ......... 361/736–737, 749–750; 174/254–258; 235/375–492
See application file for complete search history.

(56) References Cited

U.S. PATENT DOCUMENTS

| 6,019,284 | A | * | 2/2000 | Freeman | G02F 1/13452 |
| | | | | | 235/375 |
| 7,090,139 | B2 | * | 8/2006 | Kasuga | G06K 19/0718 |
| | | | | | 235/380 |
| 8,136,725 | B2 | * | 3/2012 | Yamazaki | G06K 19/0704 |
| | | | | | 235/380 |
| 2003/0052865 | A1 | * | 3/2003 | Miller | 345/173 |
| 2003/0209362 | A1 | | 11/2003 | Kasuga et al. | |
| 2007/0000998 | A1 | * | 1/2007 | Lu et al. | 235/380 |
| 2008/0067247 | A1 | * | 3/2008 | McGregor | G06K 19/07 |
| | | | | | 235/439 |
| 2009/0037275 | A1 | * | 2/2009 | Pollio | 705/14 |

(Continued)

FOREIGN PATENT DOCUMENTS

| CN | 101001303 | 7/2007 |
| CN | 201166947 | 12/2008 |
| TW | 546599 | 8/2003 |

OTHER PUBLICATIONS

"Office Action of Taiwan Counterpart Application", issued on Jul. 25, 2014, p. 1-p. 6.

(Continued)

*Primary Examiner* — Tuan T Dinh
(74) *Attorney, Agent, or Firm* — Jianq Chyun IP Office

(57) ABSTRACT

An electronic card including a substrate and a display panel is provided. The substrate has a first surface, a second surface opposite to the first surface, a first side, a second side opposite to the first side, a third side and a fourth side opposite to the third side, wherein the first surface and the second surface are surrounded by the first side, the second side, the third side and the fourth side. The display panel is disposed on the first surface and is roughly near the first side, the third side and the fourth side. Therefore, a disposition area of the display panel is wider.

4 Claims, 3 Drawing Sheets

(56) References Cited

U.S. PATENT DOCUMENTS

2009/0146804 A1* 6/2009 August ............... G06Q 30/02
340/539.13
2009/0309736 A1* 12/2009 Heurtier ............. G06K 19/041
340/572.8
2010/0052908 A1* 3/2010 Doan ............... G06K 19/0716
340/572.1
2011/0279242 A1* 11/2011 Krawczewicz .............. 340/10.6
2011/0292578 A1* 12/2011 Lim .................. H04M 1/0239
361/679.01

OTHER PUBLICATIONS

"Office Action of China Counterpart Application", issued on Jul. 17, 2015, p.1-p. 6.
Office Action of China Counterpart Application, issued on Aug. 9, 2016, p. 1-p. 7.

* cited by examiner

ELECTRONIC CARD

CROSS-REFERENCE TO RELATED APPLICATION

This application claims the priority benefit of Taiwan application serial no. 101107800, filed on Mar. 8, 2012. The entirety of the above-mentioned patent application is hereby incorporated by reference herein and made a part of this specification.

BACKGROUND OF THE INVENTION

1. Field of the Invention

This invention is related to an electronic card, and more particularly to an electronic card equipped with a display panel.

2. Description of Related Art

Nowadays, electronic cards (e.g. credit card, access card, etc.) have been in widespread use and have become one of the indispensable electronic products for modern people. Moreover, as semiconductor technology develops, complexity of circuits on a single chip has increased, thus resulting in more and more functions being available on a single chip and a trend toward thinner area of a chip. To achieve a multifunction electronic card, a display panel and buttons are disposed onto an electronic card, such that the buttons provide capability to operate the electronic card, and the display panel provides a user interface.

Generally speaking, in an electronic card, the larger the area of a display panel, the more information the display panel can display, i.e. the display panel may provide a better user interface. However, due to a limitation on surface area of an electronic card, the area of the display panel may be limited by disposing manners of the display panel and the other elements (e.g. chip, control unit, etc.) in the electronic card. According to the above, the issue of how to dispose the display panel and other elements (e.g. chip, control unit, etc.) so as to increase the disposition area of the display panel has become important in designing an electronic card equipped with a display panel.

SUMMARY OF THE INVENTION

The invention is directed to an electronic card, wherein a display panel is disposed on a first surface of a substrate, and the display panel is near three sides of the first surface, such that a disposition area of the display panel is wider.

The invention provides an electronic card including a substrate and a display panel. The substrate has a first surface, a second surface opposite to the first surface, a first side, a second side opposite to the first side, a third side and a fourth side opposite to the third side, wherein the first surface and the second surface are surrounded by the first side, the second side, the third side and the fourth side. The display panel is disposed on the first surface and is roughly near the first side, the third side and the fourth side.

Based on the above, in the electronic card in the embodiments of the invention, the display panel is disposed roughly near the first side, the third side and the fourth side of the substrate, such that a disposition area of the display panel is wider.

In order to make the aforementioned features and advantages of the invention more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE EMBODIMENTS

Figure 1A:
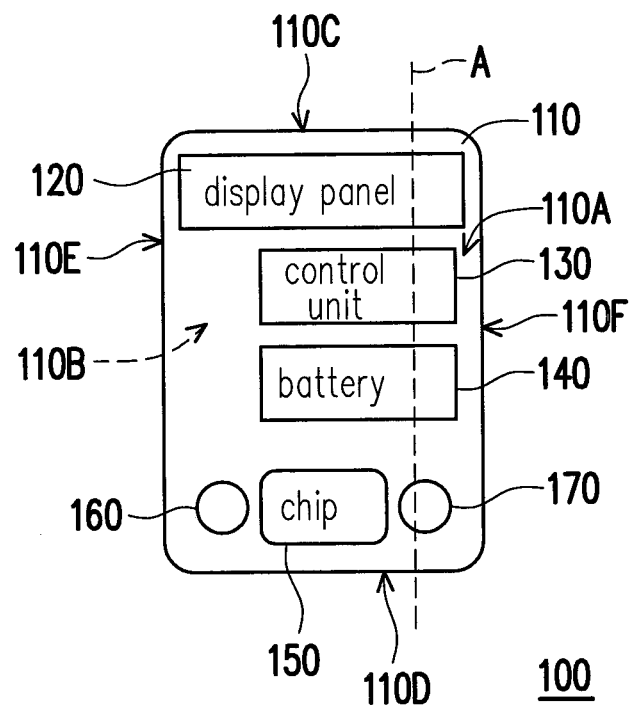
FIG. 1A is a schematic drawing of the disposition of an electronic card according to the first embodiment of the invention.
Figure 1B:
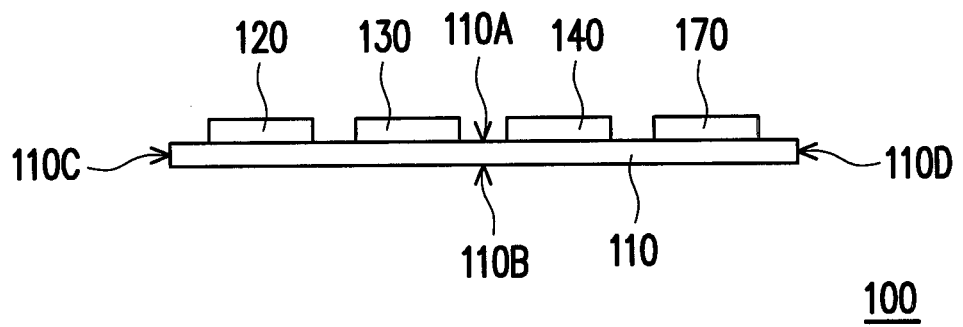
FIG. 1B is a schematic drawing of a profile of the electronic card of FIG. 1A along sectional line A.

FIG. 1A is a schematic drawing of the disposition of an electronic card according to the first embodiment of the invention. FIG. 1B is a schematic drawing of a profile of the electronic card of FIG. 1A along sectional line A. Referring to FIG. 1A and FIG. 1B, in this embodiment, an electronic card 100 includes a substrate 110, a display panel 120, a control unit 130, a battery 140, a chip 150, and buttons 160, 170. The substrate 110 has a first surface 110A, a second surface 110B opposite to the first surface 110A, a first side 110C, a second side 110D opposite to the first side 110C, a third side 110E and a fourth side 110F opposite to the third side 110E, wherein the first surface 110A and the second surface 110B of the substrate 110 may be surrounded by the first side 110C, the second side 110D, the third side 110E and the fourth side 110F of the substrate 110.

In the electronic card 100, the display panel 120, the control unit 130, the battery 140, the chip 150, and the buttons 160, 170 are disposed on the first surface 110A of the substrate 110, wherein the display panel 120, the control unit 130, the battery 140 and the chip 150 are disposed in sequence from the first side 110C of the substrate 110 to the second side 110D of the substrate 110, i.e. the control unit 130 and the battery 140 are disposed between the display panel 120 and the chip 150. The buttons 160, 170 may be disposed roughly near the chip 150. On the substrate 110, the circuits relevant to the display panel 120, the control unit 130, the battery 140, the chip 150, and the buttons 160, 170, such as the driving circuit of the display panel 120, the circuit layout of the control unit 130, and so on, may be disposed.

In this embodiment, the display panel 120 may be roughly near the first side 110C, the third side 110E and the fourth side 110F of the substrate 110. The control unit 130 is disposed between the display panel 120 and the battery 140, and the control unit 130 and the battery 140 are disposed roughly near the fourth side 110F. The chip 150 is disposed roughly near the second side 110D of the substrate 110, and the buttons 160, 170 may be disposed at two sides of the chip 150, i.e. the button 160 is disposed roughly near the second side 110D, the third side 110E of the substrate 110 and the chip 150; the button 170 is disposed roughly near the second side 110D, the fourth side 110F of the substrate 110 and the chip 150.

According to the above, the display panel 120 may be disposed roughly near the first side 110C, the third side 110E and the fourth side 110F of the substrate 110, such that the display panel 120 may have a wider disposition area, i.e. the display panel 120 with a wider size may be disposed, and the electronic card 100 may provide a better user interface by the wider display panel 120. In another embodiment of the invention, the control unit 130 may be disposed between the battery 140 and the chip 150, and the control unit 130 and the battery 140 may be disposed roughly near the third side 110E.

Figure 2A:
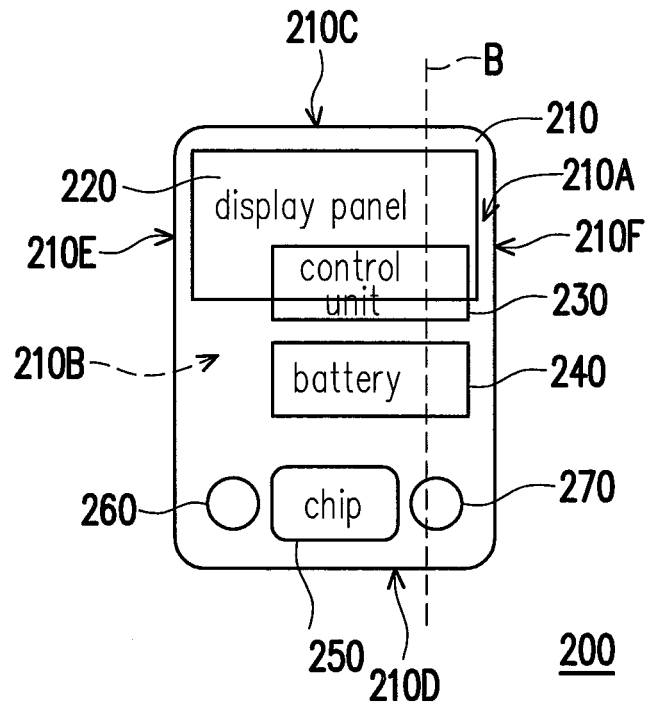
FIG. 2A is a schematic drawing of the disposition of an electronic card according to the second embodiment of the invention.
Figure 2B:
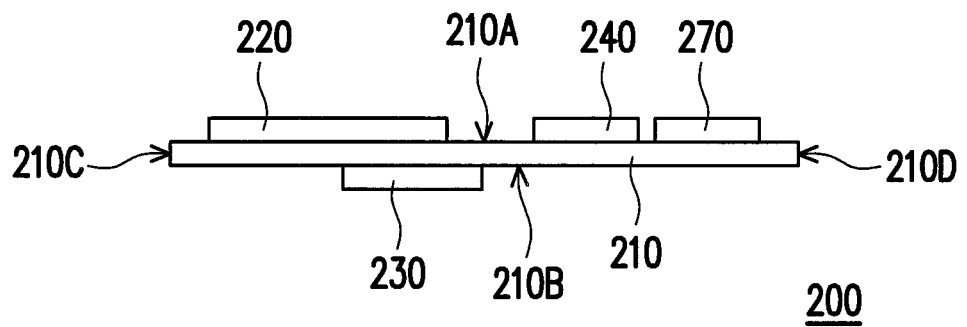
FIG. 2B is a schematic drawing of a profile of the electronic card of FIG. 2A along sectional line B.

FIG. 2A is a schematic drawing of the disposition of an electronic card according to the second embodiment of the invention. FIG. 2B is a schematic drawing of a profile of the electronic card of FIG. 2A along sectional line B. Referring to FIG. 2A and FIG. 2B, in this embodiment, an electronic card 200 includes a substrate 210, a display panel 220, a control unit 230, a battery 240, a chip 250 and buttons 260, 270. The substrate 210 has a first surface 210A, a second surface 210B opposite to the first surface 210A, a first side 210C, a second side 210D opposite to the first side 210C, a third side 210E and a fourth side 210F opposite to the third side 210E, wherein the first surface 210A and the second surface 210B of the substrate 210 may be surrounded by the first side 210C, the second side 210D, the third side 210E and the fourth side 210F of the substrate 210.

In the electronic card 200, the display panel 220, the battery 240, the chip 250, and the buttons 260, 270 are disposed on the first surface 210A of the substrate 210; the control unit 230 of the electronic card 200 is disposed on the second surface 210B of the substrate 210. The display panel 220, the battery 240 and the chip 250 are disposed in sequence from the first side 210C of the substrate 210 to the second side 210D of the substrate 210, i.e. the battery 240 is disposed between the display panel 220 and the chip 250. In this embodiment, an orthographic projection of the control unit 230 on the substrate 210 and the display panel 220 partially overlap. The buttons 260, 270 may be disposed roughly near the chip 250. On the substrate 210, the circuits relevant to the display panel 220, the control unit 230, the battery 240, the chip 250, and the buttons 260, 270, such as the driving circuit of the display panel 220, the circuit layout of the control unit 230, and so on, may be disposed.

In this embodiment, the display panel 220 may be roughly near the first side 210C, the third side 210E and the fourth side 210F of the substrate 210. The battery 240 is disposed between the display panel 220 and the chip 250, and is disposed roughly near the fourth side 210F. The chip 250 is disposed roughly near the second side 210D of the substrate 210, and the buttons 260, 270 may be disposed at two sides of the chip 250, i.e. the button 260 is disposed roughly near the second side 210D, the third side 210E of the substrate 210 and the chip 250; the button 270 is disposed roughly near the second side 210D, the fourth side 210F of the substrate 210 and the chip 250.

According to the above, the display panel 220 may be disposed roughly near the first side 210C, the third side 210E and the fourth side 210F of the substrate 210, and the disposition position of the display panel 220 and an orthographic projection of the disposition position of the control unit 230 on the substrate 210 partially overlap, such that the display panel 220 may have a wider disposition area, i.e. the display panel 220 with a wider size may be disposed, and the electronic card 200 may provide a better user interface by the wider display panel 220.

In another embodiment of the invention, the control unit 230 and the battery 240 may be disposed roughly near the third side 210E. Further, the orthographic projection of the control unit 230 on the substrate 210 and the display panel 220 may completely overlap, i.e. the display panel 220 may completely overlay the orthographic projection of the control unit 230 on the substrate 210.

Figure 3A:
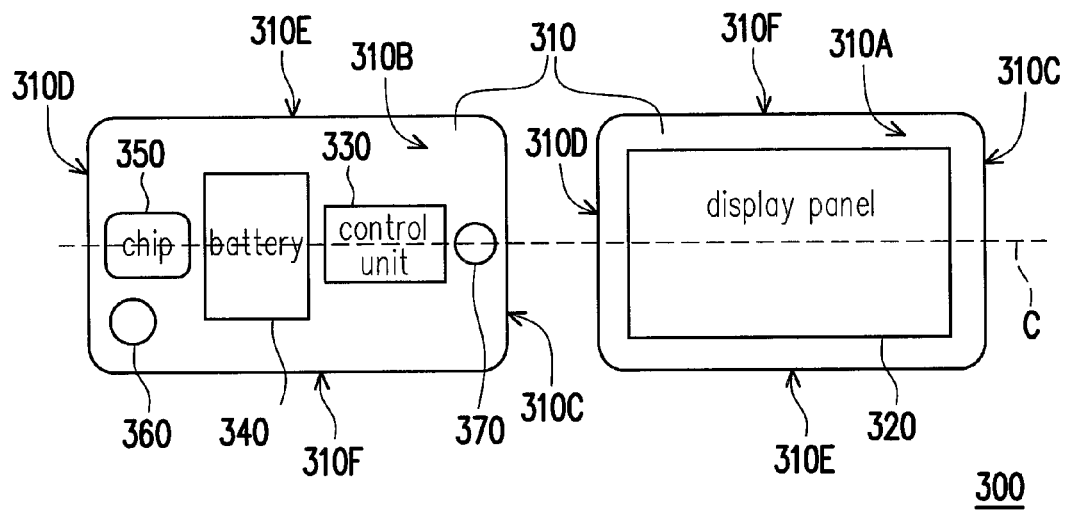
FIG. 3A is a schematic drawing of the disposition of an electronic card according to the third embodiment of the invention.
Figure 3B:
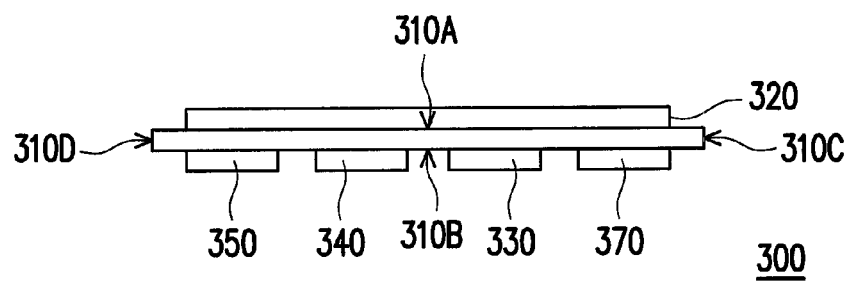
FIG. 3B is a schematic drawing of a profile of the electronic card of FIG. 3A along sectional line C.

FIG. 3A is a schematic drawing of the disposition of an electronic card according to the third embodiment of the invention. FIG. 3B is a schematic drawing of a profile of the electronic card of FIG. 3A along sectional line C. Referring to FIG. 3A and FIG. 3B, in this embodiment, an electronic card 300 includes a substrate 310, a display panel 320, a control unit 330, a battery 340, a chip 350 and buttons 360, 370. The substrate 310 has a first surface 310A, a second surface 310B opposite to the first surface 310A, a first side 310C, a second side 310D opposite to the first side 310C, a third side 310E and a fourth side 310F opposite to the third side 310E, wherein the first surface 310A and the second surface 310B of the substrate 310 may be surrounded by the first side 310C, the second side 310D, the third side 310E and the fourth side 310F of the substrate 310.

The display panel 320 of the electronic card 300 is disposed on the first surface 310A, and the display panel 320 may be roughly near the first side 310C, the second side 310D, the third side 310E and the fourth side 310F of the substrate 310. The control unit 330, the battery 340, the chip 350 and the buttons 360, 370 of the electronic card 300 are disposed on the second surface 310B of the substrate 310. In this embodiment, orthographic projections of the control unit 330, the battery 340, the chip 350 and the buttons 360, 370 on the substrate 310 completely overlap with the display panel 320, i.e. the display panel 320 may completely overlay the orthographic projections of the control unit 330, the battery 340, the chip 350 and the buttons 360, 370 on the substrate 310. On the substrate 310, the circuits relevant to the display panel 320, the control unit 330, the battery 340, the chip 350 and the buttons 360, 370, such as the driving circuit of the display panel 320, the circuit layout of the control unit 330, and so on, may be disposed.

In this embodiment, the button 370, the control unit 330, the battery 340 and the chip 350 are disposed in sequence from the first side 310C of the substrate 310 to the second side 310D of the substrate 310, i.e. the control unit 330 and the battery 340 are disposed between the button 370 and the chip 350, and the button 360 may be disposed roughly near the chip 350. In another embodiment of the invention, the disposing manners and positions of the control unit 330, the battery 340, the chip 350 and the buttons 360, 370 on the second surface 310B may be designed by persons of ordinary skill in the art. However, the disposition positions of the control unit 330, the battery 340, the chip 350 and the buttons 360, 370 may be roughly near but do not overlap with one another. For example, either or both of the buttons 360, 370 may be disposed roughly near one of the first side 310C, the second side 310D, the third side 310E and the fourth side 310F; the chip 350 may be disposed roughly near one of the first side 310C and the second side 310D.

According to the above, since the display panel 320 is disposed on the first surface 310A and the control unit 330, the battery 340, the chip 350 and the buttons 360, 370 are disposed on the second surface 310B, the display panel 320 may be disposed roughly near the first side 310C, the second side 310D, the third side 310E and the fourth side 310F of the substrate 310, such that the display panel 320 may have a wider disposition area, i.e. the display panel 320 with a wider size may be disposed, and the electronic card 300 may provide a better user interface by the wider display panel 320.

Figure 4:
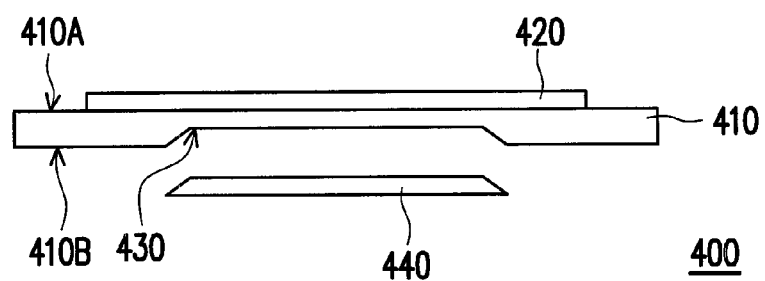
FIG. 4 is a schematic drawing of a profile of an electronic card according to the fourth embodiment of the invention.

FIG. 4 is a schematic drawing of a profile of an electronic card according to the fourth embodiment of the invention. Referring to FIG. 4, in this embodiment, an electronic card 400 includes a substrate 410, a display panel 420 and a battery 440. The substrate 410 has a first surface 410A and a second surface 410B opposite to the first surface 410A. The display panel 420 is disposed on the first surface 410A of the substrate 410, and a battery slot 430 may be formed in the second surface 410B of the substrate 410 for disposing the battery 440, for convenience of replacement of the battery 440, wherein the battery 440 may be fixed in the battery slot 430 through mount techniques or tenon structures, which may be designed by persons of ordinary skill in the art. Further, the electronic card 400 may be equipped with other elements, such as a control unit, a chip, or a button. Regarding the disposing manner of these elements, the descriptions of the electronic cards 100, 200 and 300 have offered a good reference, and thus an explanation is omitted.

In conclusion to the above, in the electronic card of the embodiments of the invention, the display panel is disposed roughly near the first side, the third side and the fourth side of the substrate; alternatively, the display panel is made to partially overlap with an orthographic projection of the control unit on the substrate, such that the display panel may have a wider disposition area; alternatively, the display panel is disposed on the first surface of the substrate and the other elements are disposed on the second surface of the substrate, such that the display panel may be disposed roughly near the first side, the second side, the third side and the fourth side of the substrate, such that the display panel may have a wider disposition area. Furthermore, a battery slot may be formed on the second surface of the substrate, for convenience of replacement of a battery.

Though the invention has been disclosed above by the embodiments, they are not intended to limit the invention. It will be apparent to one of ordinary skill in the art that modifications and variations to the described embodiments may be made without departing from the spirit and scope of the invention. Therefore, the protecting range of the invention falls in the appended claims.

What is claimed is:

1. An electronic card, comprising:
   a substrate having a first surface, a second surface opposite to the first surface, a first side, a second side opposite to the first side, a third side and a fourth side opposite to the third side, wherein the first surface and the second surface are surrounded by the first side, the second side, the third side and the fourth side;
   a display panel physically and directly disposed on the first surface and roughly near the first side, the third side and the fourth side;
   a control unit physically and directly disposed on the second surface;
   a button physically and directly disposed on the first surface and roughly near the second side;
   a chip physically and directly disposed on the first surface and roughly disposed near the button for storage; and
   a battery physically and directly disposed on the first surface and between the display panel and the chip,
   wherein the display panel and an orthographic projection of the control unit on the substrate only partially overlap,
   wherein the electronic card is a credit card or an access card,
   wherein the display panel, the battery and the chip are disposed in sequence from the first side to the second side.

2. The electronic card as claimed in claim 1, wherein the battery, the chip, the button and the orthographic projection of the control unit on the substrate do not overlap.

3. An electronic card comprising:
   a substrate having a first surface, a second surface opposite to the first surface, a first side, a second side opposite to the first side, a third side and a fourth side opposite to the third side, wherein the first surface and the second surface are surrounded by the first side, the second side, the third side and the fourth side;
   a display panel physically and directly disposed on the first surface and roughly near the first to the fourth sides; and
   a control unit, a battery, a button and a chip, all physically and directly disposed on the second surface,
   wherein the electronic card is a credit card or an access card,
   wherein the button, the control unit, the battery and the chip are disposed in sequence from the first side to the second side, and orthographic projections of the button, the control unit, the battery and the chip all on the substrate completely overlap with the display panel.

4. The electronic card as claimed in claim 3, further comprising:
   a battery slot physically and directly formed on the second surface, and configured to dispose the battery.

* * * * *